US006451450B1

(12) United States Patent
Goyal et al.

(10) Patent No.: US 6,451,450 B1
(45) Date of Patent: Sep. 17, 2002

(54) METHOD OF DEPOSITING A PROTECTIVE LAYER OVER A BIAXIALLY TEXTURED ALLOY SUBSTRATE AND COMPOSITION THEREFROM

(75) Inventors: Amit Goyal, Knoxville, TN (US); Donald M. Kroeger, Knoxville, TN (US); Mariappan Paranthaman, Knoxville, TN (US); Dominic F. Lee, Knoxville, TN (US); Roeland Feenstra, Knoxville, TN (US); David P. Norton, Gainesville, FL (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 09/563,665

(22) Filed: May 2, 2000

Related U.S. Application Data

(63) Continuation-in-part of application No. 09/248,300, filed on Feb. 11, 1999, now Pat. No. 6,235,402, which is a division of application No. 08/922,173, filed on Sep. 2, 1997, now Pat. No. 6,077,344, and a continuation-in-part of application No. 08/419,583, filed on Apr. 10, 1995, now Pat. No. 5,741,377.

(51) Int. Cl.$^7$ .............................. B32B 15/04; C22F 1/00
(52) U.S. Cl. ...................... 428/629; 428/469; 428/697; 428/699; 428/702; 428/680; 505/775; 505/779; 505/812; 148/512; 148/525; 148/537; 427/62
(58) Field of Search ................................ 428/472, 409, 428/697, 699, 701, 702, 469, 667, 672, 680; 505/125, 126, 779, 812; 148/512, 525, 537, 629

(56) References Cited

U.S. PATENT DOCUMENTS 5,741,377 A    4/1998  Goyal et al.
5,872,080 A *  2/1999  Arendt et al.
5,898,020 A    4/1999  Goyal et al.
5,958,599 A    9/1999  Goyal et al.
5,964,966 A   10/1999  Goyal et al.
6,159,610 A * 12/2000  Paranthaman et al. ...... 428/472

OTHER PUBLICATIONS

He et al. Deposition of biaxially–oriented metal and oxide buffer–layer films on textured Ni tapes: New substrates for high–current, high–temperature superconductors. Physica—C—Superconductivity, vol. 275 Issue: 1–2, Feb. 10, 1997. pp. 155–161.*

Dimos et al., "Orientation Dependence of Grain–Boundary Critical Currents in $YBa_2Cu_3O_7$—$\delta$ Bicrystals," Phys. Rev. Lett. 61:219–222, 1988 No Month.

Dimos et al., "Superconducting transport properties of grain boundaries in $YBa_2Cu_3O_7$—Bicrystals," Phys. Rev. B 41:4038–4049, 1990 No Month.

Cardona et al., Phys. Lett., "Transport characteristics of $Tl_2Ba_2CaCu_2O_8$ bicrystal grain boundary junctions at 77K," 62(4):411–413, 1993 No Month.

(List continued on next page.)

*Primary Examiner*—Deborah Jones
*Assistant Examiner*—Jennifer McNeil
(74) *Attorney, Agent, or Firm*—Akerman Senterfitt

(57) ABSTRACT

A laminate article consists of a substrate and a biaxially textured protective layer over the substrate. The substrate can be biaxially textured and also have reduced magnetism over the magnetism of Ni. The substrate can be selected from the group consisting of nickel, copper, iron, aluminum, silver and alloys containing any of the foregoing. The protective layer can be selected from the group consisting of gold, silver, platinum, palladium, and nickel and alloys containing any of the foregoing. The protective layer is also non-oxidizable under conditions employed to deposit a desired, subsequent oxide buffer layer. Layers of YBCO, $CeO_2$, YSZ, $LaAlO_3$, $SrTiO_3$, $Y_2O_3$, $RE_2O_3$, $SrRuO_3$, $LaNiO_3$ and $La_2ZrO_3$ can be deposited over the protective layer. A method of forming the laminate article is also disclosed.

35 Claims, 11 Drawing Sheets

OTHER PUBLICATIONS

Kawasaki et al., "Weak link behavior of grain boundaries in Nd–, Bi–, and Tl–based cuprate superconductors," Appl. Phys. Lett., 62(4), 417–419, 1993 No Month.

Nabatame et al., "Transport superconducting properties of grain boundaries in $Tl_1Ba_2Ca_2Cu_3O_x$ thin films," Appl. Phys. Lett. 65(6), 776–778, 1994 No Month.

Tomita et al., "The Superconducting Properties of [001] Twist Boundaries in a Bi–Sr–Ca–Cu–O Superconductor," Jpn. J. Appl. Phys., 31, L942–L945, 1992 No Month.

Wang et al., "Electromagnetic coupling character of [001] twist boundaries in sintered $Bi_2Sr_2CaCu_2O_{8+x}$ bicrystals," Physica C 230, 189–198, 1994 No Month.

Iijima et al., "Structural and transport properties of biaxially aligned $YBa_2Cu_3O_{7-x}$ films on polycrystaline Ni–based alloy with ion–beam–modified buffer layers," J. of Appl. Phys., 74(3):1905–1911, 1993 No Month.

Reade et al., "Laser deposition of biaxially textured yttria-stabilized zirconia buffer layers on polycrystaline metallic alloys for high critical current Y–Ba–Cu–O thin films," Appl. Phys. Lett., 61(19):2231–2233, 1992 No Month.

Wu et al., "High current $YBa_2Cu_3O_{7-\delta}$ thick films on flexible nickel substrates with textured buffer layers," Appl. Phys. Lett., 65(15):1961–1963, 1994 No Month.

A. Goyal, et al., "High Critical Current Density $YBa_2Cu_3O_x$ Tapes Using the RABiTs Approach," J. of Superconductivity, 11(5), 481–487, 1998 No Month.

J.V. Cathcart, et al., "The Structure of Thin Oxide Films Formed on Nickel Crystals," J. Electrochem. Soc. 116:664–668, 1969 No Month.

A. Goyal, et al., "Conductors with controlled grain boundaries: An approach to the next generation, high temperature superconducting wire," 12(11), 2924–2940, 1997 No Month.

X. Cui, et al., "Continuous growth of epitaxial $CeO_2$ buffer layers on rolled Ni tapes by electron beam evaporation," Physica C 316, pp. 27–33, 1999 No Month.

F.A. List, et al., "High $J_c$ YBCO films on biaxially textured Ni with oxide buffer layers deposited using electron beam evaporation and sputtering," Physica C 302, p. 87–92, 1998 No Month.

R. Feenstra, et al., "Effect of Oxygen pressure on the synthesis of $YBa_2Cu_3O_{7-x}$ thin films by post–deposition annealing," J. Appl. Phys., 69:6569–6585, 1991 No month.

C. Park, et al., "Bend strain tolerance of critical currents for $YBa_2Cu_3O_7$ films deposited on rolled–textured (001) Ni," Appl. Phys. Lett., 73(13):1904–1906, 1998 No Month.

* cited by examiner

Fig. 1a: (111) X-ray Pole Figure
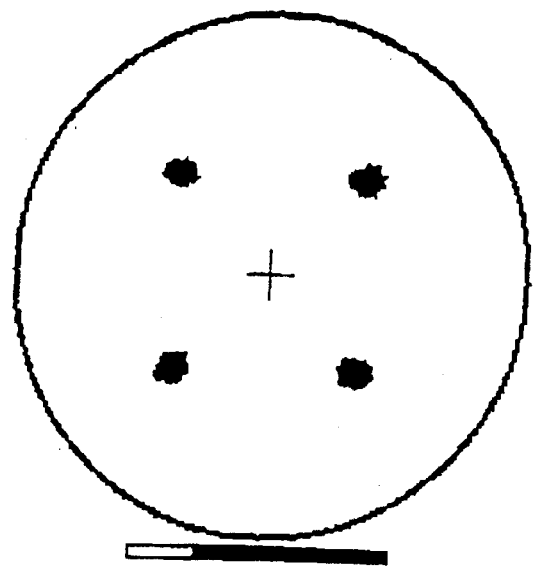
Fig. 1b: (111) X-ray Phi Scan
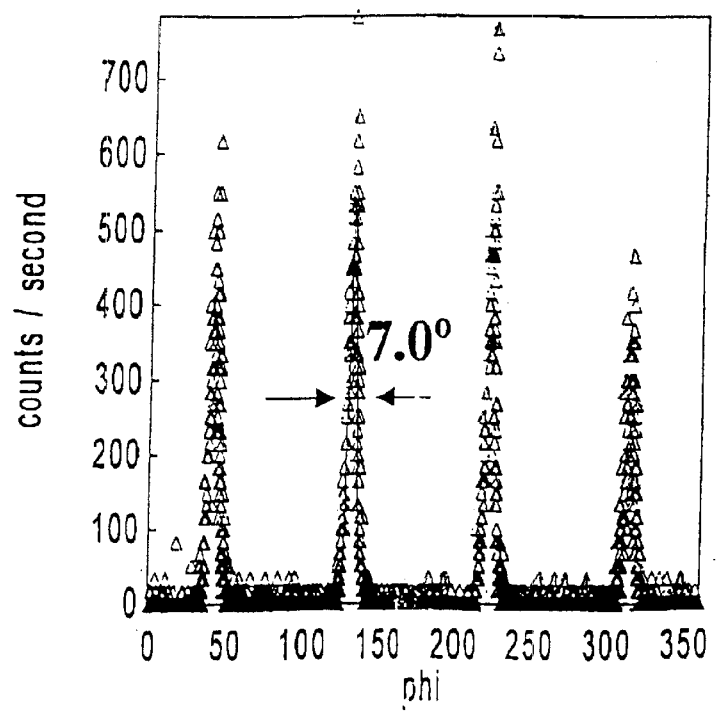

Fig. 2
Grain ≤ 1°
Grain ≤ 4°
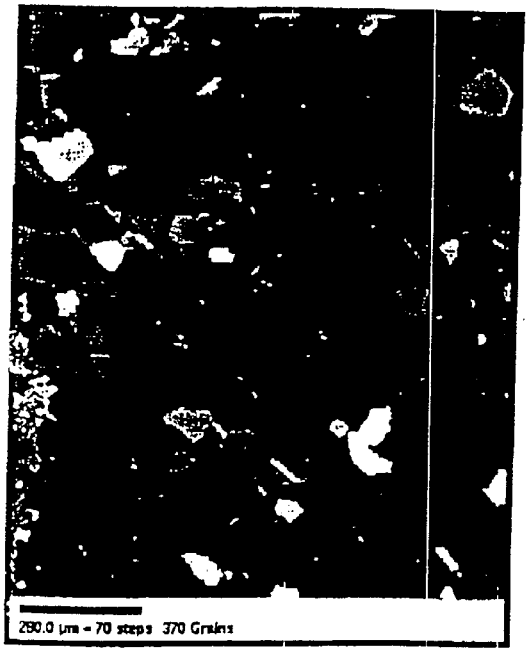
Grain ≤ 5°
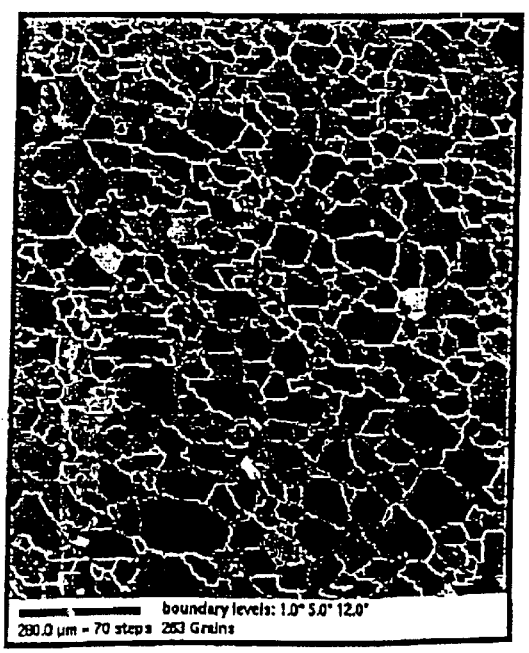

Fig. 5

Rocking Curves

| In | About |
|---|---|
| YBCO 3.7° | YBCO 6.9° |
| YSZ 4.3° | YSZ 7.9° |
| CeO$_2$ 4.4° | CeO$_2$ 7.0° |
| Ni-13%Cr 4.7° | Ni-13%Cr 9.2° |

Fig. 8a: (111) X-ray Pole Figure
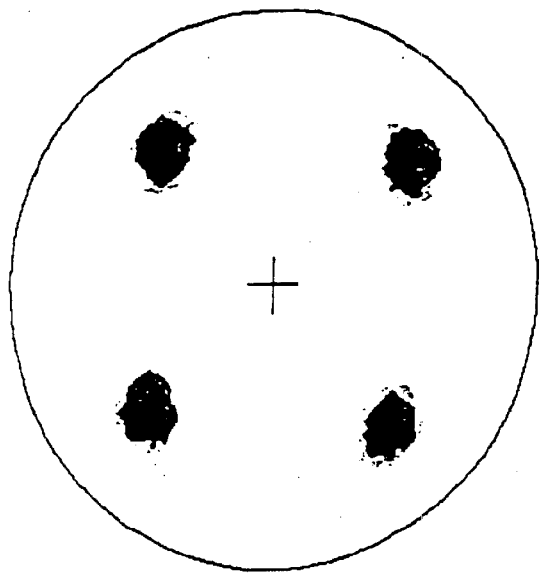
Fig. 8b: (111) X-ray Phi Scan
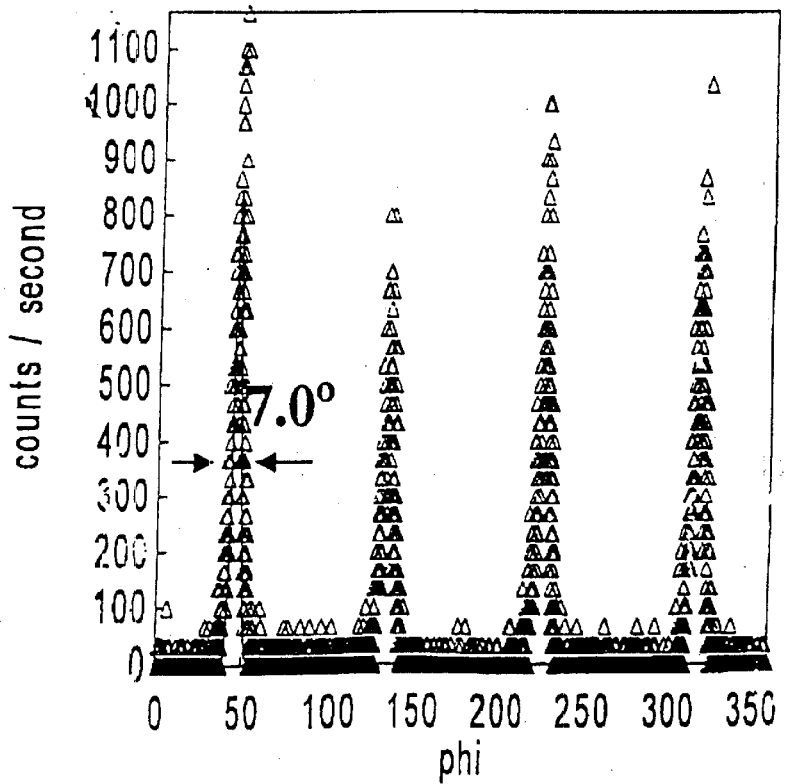

METHOD OF DEPOSITING A PROTECTIVE LAYER OVER A BIAXIALLY TEXTURED ALLOY SUBSTRATE AND COMPOSITION THEREFROM

CROSS-REFERENCE TO RELATED APPLICATION

This Application is a Continuation-In-Part of application Ser. No. 09/248,300 filed on Feb. 11, 1999, now U.S. Pat. No. 6,235,402 on May 22, 2001, which is a division of application Ser. No. 08/922,173, filed Sep. 2, 1997, now U.S. Pat. No. 6,077,344; and a Continuation-In-Part of patent application Ser. No. 08/419,583 filed Apr. 10, 1995, now U.S. Pat. No. 5,741,377.

STATEMENT REGARDING FEDERALLY SPONSORED RESEARCH AND DEVELOPMENT

This invention was made with government support under contract DE-AC05-96OR22464, awarded by the United States Department of Energy to UT-Battelle, LLC, and the United States Government has certain rights in this invention.

FIELD OF THE INVENTION

This invention relates to biaxially textured buffer layers on metal substrates. More specifically, the invention relates to a process for depositing a protective layer over a biaxially textured substrate and the resulting composition.

BACKGROUND OF THE INVENTION

Biaxially textured buffer layers on metal substrates are potentially useful in electronic devices where a biaxially textured electronically active layer is desired. The electronically active layer may be a superconductor, a semiconductor, or a ferro-electric material.

For example, the next generation of superconducting wire to be used for power transmission lines is likely to have a multi-layer structure. Such deposited conductor systems consist of a metal substrate, buffer layer, and a superconducting layer. The metal substrate, such as Ni and its Ni alloys, provides flexibility and support for the wire. Buffer layers, such as metal oxide buffer layers including cerium oxide ($CeO_2$) and yttria-stabilized zirconia (YSZ), comprise the next layer and serve as chemical barriers between the metal substrate and the top layer, the high-temperature superconductor.

Many device applications require a good control of the grain boundary character for the materials that comprise the device. For example, grain boundary character is very important in high temperature superconductors. The effects of grain boundary characteristics on current transmission across the boundary have been very clearly demonstrated for $YBa_2Cu_3O_x$ (Y123). For clean, stoichiometric boundaries, $J_c(gb)$, the grain boundary critical current, appears to be determined primarily by the grain boundary misorientation.

The dependence of $J_c(gb)$ on misorientation angle has been determined (Dimos et al., Phys. Rev. Lett. 61, 219, 1988; Dimos et al., Phys. Rev. B 41, 4038, 1990) in Y123 for grain boundary types which can be formed in epitaxial films on bicrystal substrates. These include [001] tilt, [100] tilt, and [100] twist boundaries. In each case, high angle boundaries were found to be weak-linked. The low $J_c$ observed in randomly oriented polycrystalline Y123 can be understood on the basis that the population of low angle boundaries is small and that frequent high angle boundaries impede long-range current flow.

Recently, the Dimos experiment has been extended to artificially fabricated [001] tilt bicrystals in $Tl_2Ba_2CaCu_2O_8$ (Cardona et al., Phys. Lett., 62 (4), 411, 1993), $Tl_2Ba_2Ca_2Cu_3O_x$ (Kawasaki et al., Appl. Phys. Lett., 62 (4), 417 1993), $TlBa_2Ca_2Cu_2O_x$ (Nabatame et al., Appl. Phys. Lett. 65 (6), 776 1994) and $Nd_{1.85}Ce_{0.15}CuO_4$ (Kawasaki et al.). In each case it was found that, as in Y123, $J_c$ depends strongly on grain boundary misorientation angle. Although no measurements have been made on $Bi_2Sr_2Ca_2Cu_3O_x$ (Bi-2223), data on current transmission across artificially fabricated grain boundaries in Bi-2212 indicate that most large angle [001] tilt and twist boundaries are weak links, with the exception of some coincident site lattice (CSL) related boundaries (Tomita et al., Jpn. J. Appl. Phys., 29, L30, 1990; Tomita et al., Jpn. J. Appl. Phys., 31, L942, 1992; Wang et al., Physica C, 230, 189, 1994). It is likely that the variation in $J_c$ with grain boundary misorientation in Bi-2212 and Bi-2223 is similar to that observed in the well characterized cases of Y123 and Tl-based superconductors.

To fabricate high temperature superconductors with very high critical current densities, the grains are therefore preferably aligned. This has been shown to result in significant improvement in the superconducting properties of YBCO films (Iijima et al., J. of Appl. Phys., 74, 1905, 1993; Reade et al., Appl. Phys. Lett., 61, 2231, 1992; Wu et al., Appl. Phys. Lett., 65, 1961, 1994). Most preferably, the grains should be aligned both out-of-plane with respect to the substrate (c-axis oriented) and in-plane with respect to the substrate (a-b alignment). To achieve this alignment, high $T_c$ superconductors have generally been deposited on (100) oriented single-crystal oxide substrates. However, single-crystal substrates are generally too expensive and have poor mechanical properties. As such, single-crystal substrates are presently unsuitable as practical conductors.

A method to develop practical coated conductors is disclosed in U.S. Pat. No. 5,741,377 ('377) by Goyal et al. This method called RABiTs, an abbreviation for "rolling assisted biaxially textured substrates," uses roll-texturing of metal to form a metallic tape with a {100}<001> cubic structure. However, if the metal is nickel or a nickel alloy, a buffer layer between the metal substrate and the ceramic superconductor is necessary to prevent interdiffusion of the ceramic superconductor and the metal substrate and also to prevent the oxidation of nickel substrate during the deposition of the superconducting layer. Useful buffer layers include cerium oxide, yttrium stabilized zirconia (YSZ), strontium titanium oxide, rare-earth aluminates, other perovskites, various rare-earth oxides, and nitrides.

To achieve high critical current densities, it is important that the biaxial orientation be transferred from the substrate to the superconducting material. As stated, a biaxially textured metal substrate can be provided by the method disclosed in the '377 patent. The processes that are currently used to grow buffer layers on metal substrates and achieve this transfer of texture include pulsed laser deposition, sputtering, electron beam evaporation and sol-gel techniques. Researchers have recently used such techniques to grow biaxially textured $YBa_2Cu_3O_x$ (YBCO) films on metal substrate/buffer layer samples that have yielded critical current densities ($J_c$) approaching $3 \times 10^6$ A/cm² at 77° K (A. Goyal, et al., J. of Superconductivity, vol. 11, No. 5, 1998).

A further consideration during the fabrication process is the undesirable oxidation of the metal substrate, for example when using Ni. If the Ni begins to oxidize, the resulting NiO is likely to grow in the (111) orientation regardless of the orientation of the Ni (J. V. Cathcart, et al., *J. Electrochem. Soc.* 116:664, 1969). This (111) NiO orientation adversely affects the growth of biaxially textured layers and will be transferred, despite the substrate's original orientation, to the following layers.

One area of difficulty in using Ni as the substrate is due the ferromagnetic properties of Ni. This causes significant problems in practical applications involving superconductors, particularly in terms of AC losses. Biaxially textured Ni alloy substrates having reduced magnetism have been suggested as suitable substrates for the fabrications of HTS conductors (A. Goyal et al., U.S. Pat. No. 5,964,966; A. Goyal et al., U.S. Pat. Nos. 5,958,599 and 5,898,020). However, these alloy substrates have elements that form native oxide layers with undesirable crystallographic orientations. Whereas the formation of NiO can easily be prevented in pure Ni substrates, the formation of oxides of alloying elements, such as Cr, is very difficult to prevent. Typically, with Ni substrates, the deposition of oxide buffer layers is done under conditions where the formation of NiO is thermodynamically unstable and the formation of the desired oxide buffer layers is thermodynamically favorable. This is typically accomplished by performing the deposition under reducing conditions using a forming gas with oxygen provided by water vapor. It is difficult, however, to find such conditions for preventing oxidation of alloying elements of Ni used to form the non-magnetic or reduced magnetism substrates.

SUMMARY OF THE INVENTION

It is an object of this invention to provide a new and improved method for fabricating alloy and laminated structures having excellent transference of epitaxial texture through a multilayer structure.

It is another object of the invention to provide a method to produce epitaxial superconductors on a non-magnetic or reduced magnetic substrate and laminated structures having epitaxial texture.

It is yet another object of the invention to provide a method and a product of that method to prevent or significantly reduce the surface oxidation of the non-magnetic or reduced magnetic substrates, on which epitaxial buffer layers are deposited.

It is a further object of the invention to provide an epitaxial textured superconducting structure having a $J_c$ of greater than 100,000 A/cm$^2$ at 77° K and self-field.

These and other objects of the invention are achieved by a laminate article comprising a substrate and a biaxially textured protective layer over the substrate. The substrate can be biaxially textured and also have reduced magnetism relative to Ni. The substrate can be selected from the group consisting of nickel, copper, iron, aluminum and alloys containing any of the foregoing. Layers of superconducting materials such as, but not limited to YBCO, and buffer layers such, as but not limited to, CeO$_2$, YSZ, LaAlO$_3$, SrTiO$_3$, Y$_2$O$_3$, RE$_2$O$_3$, SrRuO$_3$, LaNiO$_3$, La$_2$ZrO$_3$ and TiN and combinations of the foregoing can be deposited over the protective layer.

The protective layer can be selected from the group consisting of nickel, silver, gold, platinum, and palladium and alloys containing any of the foregoing. The protective layer is also non-oxidizable under conditions used to deposit the buffer layers. A method of forming the laminate article is also disclosed.

BRIEF DESCRIPTION OF THE DRAWINGS

There are shown in the drawings embodiments of the invention that are presently preferred, it being understood, however, that the invention is not limited to the precise arrangements and instrumentalities shown, wherein:

FIG. 1*a* is a (111) pole figure observed for a Ni—13% Cr substrate.

FIG. 1*b* is a (111) phi scan of the Ni—13% Cr substrate (FWHM=7.0°).

FIG. 2 is the orientation image micrographs of the Ni—13% Cr substrate.

FIG. 5 illustrates the out-of-plane texture as determined by the rocking curves in the rolling direction and about the rolling direction of the Ni—13% Cr substrate.

FIG. 8*a* is a (111) pole figure observed for a Ni—8% V substrate.

FIG. 8*b* is a (111) phi scan of the Ni—8% V substrate (FWHM=7.0°).

DETAILED DESCRIPTION OF THE INVENTION

Figure 3:
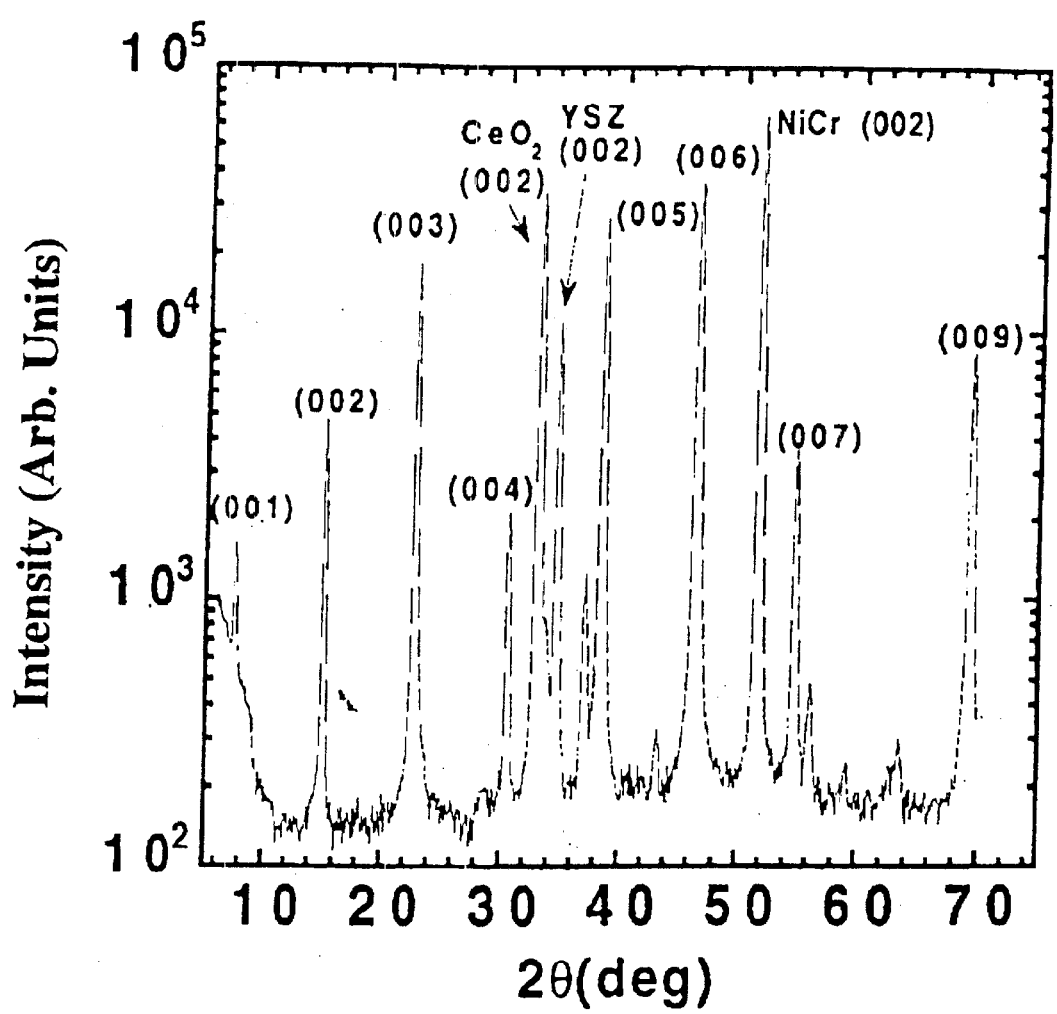
FIG. 3 is a θ-2θ scan for the final multilayer structure.

A method of depositing a protective layer for a substrate is disclosed. The method preferably comprises preparing a biaxially textured non-magnetic or reduced magnetic substrate, depositing a protective layer over the substrate, depositing at least one buffer layer over the protective layer, and depositing a superconducting layer over the buffer layer(s).

Although the substrate according to the invention is not limited as to a particular material, the presently preferred substrate is formed from a material capable of providing a desired texture. Any material capable of providing the desired texture is acceptable for use with the invention. In a preferred embodiment, the desired texture is biaxially textured, cube oriented, {100}<100>. In a most preferred embodiment, the substrate has a single texture component with the full-width-half-maximum (FWHM) of the in-plane texture of the substrate as determined by X-ray diffraction is less than 20°. Any method of preparing a biaxially textured metal substrate is acceptable for use with this invention. However, the presently preferred method of preparing the biaxially textured metal substrate is disclosed in U.S. Pat. Nos. 5,964,966; 5,958,599 and 5,898,020 by Goyal et al., which are incorporated herein by reference.

Materials capable of providing the desired texture include face centered cubic (FCC) metal alloys. These materials comprise, but are not limited to, Cu-based, Fe-based, Al-based, and Ni-based alloys. In the presently preferred embodiment, the biaxially textured substrate is formed from alloys having stacking fault frequencies below about 0.01.

Most preferably, the biaxially textured substrate is formed from cubic metals where the primary component is one of Cu, Ni, Fe, Al and Ag and the stacking fault frequency of the alloy, with all the alloying additions, is less than about 0.01 at room temperature. The preferable alloys can include some binary alloys of Ni and Cr. The preferable alloys can also include alloys having stacking fault frequencies greater than about 0.01 at room temperature if the deformation can be accomplished at higher temperatures in which the stacking fault frequency at the higher temperature is less than about 0.01. In a most preferred embodiment of the invention, the substrate is formed from a material that is non-magnetic or has reduced magnetism compared to a pure Ni substrate. In an additional embodiment, the substrate is formed from a material having a greater mechanical strength than a pure Ni substrate.

Prior to depositing the protective layer over the substrate, the substrate is preferably cleaned to remove any organics or oily residue retained from the rolling processes. Cleaning is defined in this application as any method of removing organics from the substrate. For example, the organics can be removed by cleaning methods such as vacuum annealing, electro-polishing, reverse sputtering and application of chemical solvents. However, the presently preferred method of removing organics from the substrate is to ultrasonically clean the substrate in a cleaning solution.

Any cleaning solution capable of being used during ultra-sonification is acceptable for use with this invention; however, the presently preferred cleaning solution is a combination of isopropanol, methanol and acetone. The invention is not limited as to a particular length of time in which the substrate is ultrasonically cleaned so long as the organics are removed from the substrate. A preferred range of time is between about 5–90 minutes, and a most preferred length of time is about 60 minutes. Alternatively, the substrates can also be cleaned by merely immersing the substrate in a solvent continuously, followed by high temperature annealing in a vacuum furnace or in a reducing gas such as 4% $H_2$ in argon. Regardless of the cleaning procedure employed, the substrate is annealed to form the cube texture from the as-rolled texture. The annealing is preferably performed at temperatures typically in excess of 800° C.

After the formation of the substrate, a protective layer is deposited thereon. The protective layer preferably serves many functions. One function of the protective layer is to transmit the texture from the substrate to subsequent layer (s), such as oxide buffer layers and superconducting layers, deposited over the protective layer. Another function of the protective layer is to prevent the oxidization of the substrate. The protective layer chosen must not interfere with the transfer of texture from the substrate to subsequent layers.

Assuming an oxide buffer is used, the preferred material for the protective layer is selected from those materials in which the formation of that material's oxide is thermodynamically unstable under conditions which are thermodynamically favorable for the formation of the desired oxide buffer layers. As such, a material acceptable for use as the protective layer may be determined by makeup of the subsequent layers. In a preferred embodiment, the protective layer is formed from alloys of nickel. Alternatively, the protective layer can be formed from a noble metal, such as Ag, Au, Pd, Pt, or alloys containing any of the foregoing.

Any method of depositing the protective layer over the substrate is acceptable for use with the invention. The deposited layer is preferably dense and continuous. Methods that have been successfully employed include electron beam evaporation, thermal evaporation and sputtering. In a preferred method, the protective layer is deposited using magnetron sputtering. The preferred thickness of the buffer layer depends on the chemical composition of the buffer layer and its rate of diffusion into the alloy substrate.

Upon deposition of the protective layer, additional layers such as buffer layers and superconducting layers can be deposited. Buffer layers such as $CeO_2$, YSZ, $LaAlO_3$, $SrTiO_3$, $Y_2O_3$, $RE_2O_3$, $SrRuO_3$, $LaNiO_3$, $La_2ZrO_3$ and TiN or architectures combining layers of the foregoing may be used. An example architecture over the substrate and protective layer is $YBCO/CeO_2/YSZ/CeO_2$. An alternative architecture is $YBCO/CeO_2/RE_2O_3$, $YBCO/RE_2O_3$, $YBCO/CeO_2$ or $YBCO/Y_2O_3$. The symbol "RE" represents any of the rare earth elements. Another alternate architecture is $YBCO/CeO_2$/cubic perovskite or YBCO/cubic perovskite. Any cubic perovskite, for example $SrTiO_3$, $LaAlO_3$, or $LaNiO_3$, may be used. The above-mentioned architectures are only examples, and these architectures are not intended to limit the invention to a particular superconducting/buffer layer architecture.

EXAMPLE 1

A biaxially textured Ni—13% Cr alloy substrate was fabricated. The fabrication included successive deformation of a Ni—13% Cr rod to greater than 99% deformation followed by annealing at 1000° C. for 1 hour in a high vacuum furnace. The vacuum furnace had a total pressure of ~$1 \times 10^{-6}$ Torr and an effective oxygen partial pressure at the vicinity of the substrate of ~$1 \times 10^{-8}$ Torr. Effective oxygen pressure at the vicinity of the substrate is reduced by employing oxygen absorbing metals during annealing, such tantalum boats, foils, and chips.

FIG. 1a illustrates a (111) pole figure of the resulting Ni—13% Cr substrate showing the presence of very well developed, single orientation, {100}<100> cube texture. FIG. 1b shows a (111) phi scan of the substrate showing a full-width-half-maximum (FWHM) of the in-plane texture of the substrate to be 7°. The out-of-plane texture of the substrate, as determined by omega scans, was found to be 4.7° in the rolling direction and 8.3° about the rolling direction.

FIG. 2 shows electron back scatter Kikuchi diffraction (EBKD) created orientation image micrographs of the biaxially textured substrate. The EBKD patterns were obtained on a hexagonal grid with a spacing of 4 μm. Indexing of the pattern at each location gives an unique measure of the orientation at that point. A hypothetical hexagonal lattice with a grain size of 4 μm was superimposed at each point from which a pattern was obtained. Grain boundary misorientations were then calculated for all the resulting boundaries using standard techniques. The micrograph was then regenerated with certain grain boundary criteria in order to visualize percolation of current flow should an epitaxial superconducting film be grown on such a substrate.

FIG. 2 shows shading of the sampled region of the substrate according to the criterion that a single shade represents a contiguous or percolative region of orientation less than or equal to 1°, 4° and 5°, respectively. As illustrated, most of the substrate is percolatively connected within 5°.

After preparation of the Ni—13% Cr substrate, an epitaxial layer of Ni was deposited on the Ni—13% Cr substrate. The 5 μm thick Ni layer was deposited at 300° C. using magnetron sputtering in 4% $H_2$ in Argon from a Ni sheet.

Upon deposition of the Ni layer, a 100 Å thick epitaxial layer of $CeO_2$ was deposited over the Ni layer. The $CeO_2$ layer was deposited at 500° C. by reactive evaporation of Ce metal in the presence of a forming gas having the mixture 4% $H_2$ and 96% Ar. Because of thermodynamic considerations, a partial pressure of approximately $7 \times 10^{-7}$ Torr of $H_2O$ was used during the reactive evaporation of Ce to form stoichiometric $CeO_2$.

Under these deposition conditions, oxidation of the Ni surface is not thermodynamically favorable. However, had the deposition of $CeO_2$ been done directly on the Ni—13% Cr substrate, extensive oxidation of Cr would occur. Most other Ni alloying elements, for example V and W, which can also be used to fabricate biaxially textured alloy substrates, experience a similar problem. These alloying elements tend to oxidize under conditions typically used to epitaxially form a desired oxide layer on the substrate such as $CeO_2$.

Yttria stabilized Zirconia (YSZ) films were then deposited over the $CeO_2$ layer. The 4000 Å thick YSZ layer was deposited at 780° C. using rf magnetron sputtering. After the deposition of the YSZ film, another layer of $CeO_2$ was then deposited on the YSZ layer. The 100 Å thick $CeO_2$ layer was deposited using rf magnetron sputtering.

The resulting multilayer had the following layers: Ni—13% Cr (50 μm)/Ni (5 μm)/$CeO_2$ (100 Å)/YSZ (4000 Å)/$CeO_2$ (100 Å) This structure was subsequently pre-annealed at 650° C. for 30 minutes under low oxygen partial pressures.

YBCO was deposited on the multilayer structure described above using the $BaF_2$ ex-situ process (R. Feenstra et al., U.S. Pat. No. 5,972,847). In the $BaF_2$ precursor process, precursor films comprising of Y, Cu metals and $BaF_2$ are first deposited using electron beam evaporation. The films are then annealed at high temperatures in the presence of water vapor to remove the fluorine and form the superconducting YBCO phase.

The thickness of the precursor film was 0.33 μm. The combined deposition rate was approximately 0.6 nm/s. During evaporation, the substrates were held at about 100° C., while the pressure was increased from $2 \times 10^{-6}$ Torr to $6 \times 10^{-6}$ Torr. The deposited precursor films were post-annealed at 740° C. for 60 minutes in a flowing mixture of $N_2$, $O_2$, and $H_2O$ with $pO_2$ of 200 mTorr and $pH_2O$ of about 40 Torr. Water vapor was added during the annealing process to facilitate the decomposition of $BaF_2$. At the end of the hold, the gas flow was switched to dry conditions with no water vapor. The final heat treatment was concluded with an oxidation anneal in 1 atmosphere of $O_2$ at 500° C. for 30 minutes to fully oxygenate the YBCO.

An X-ray scan of the final multilayer structure is illustrated in FIG. 3. A highly oriented set of epitaxial layers is evident with x-ray peaks present for the (100) Ni—13% Cr, (100) $CeO_2$, (100) YSZ and (001) YBCO.

Figure 4:
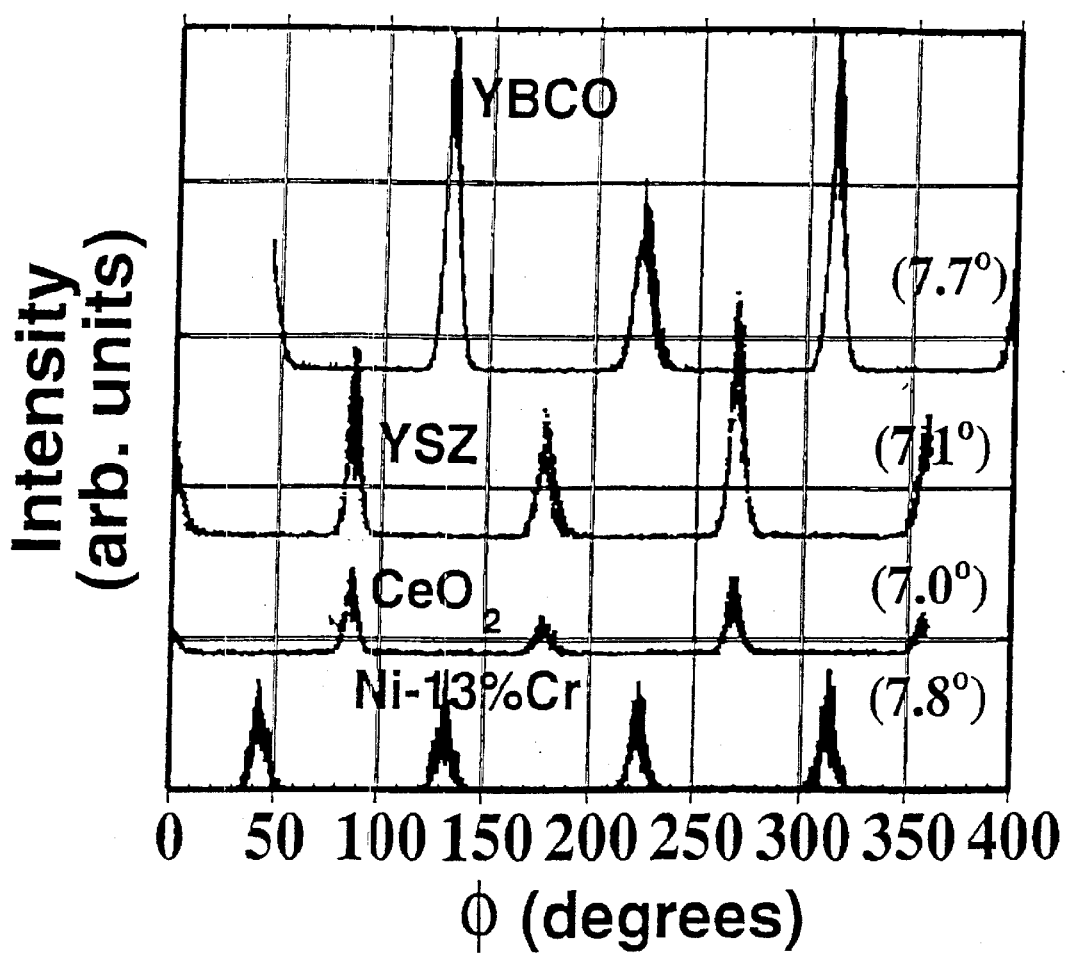
FIG. 4 is a phi scan of the YBCO (103) reflection (FWHM=7.7°), the YSZ (111) reflection (FWHM=7.1°), the CeO$_2$ (111) reflection (FWHM=7.0°), and the Ni—13% Cr (111) reflection (FWHM=7.8°) for the multilayer structure.

Respective phi scans for the layers of the multilayer structure are illustrated in FIG. 4. For each layer, only four peaks every 360° are observed. This pattern is consistent with the cube texture and single orientation epitaxy between the layers. Also, FIG. 4 includes the FWHM of the peaks for each layer. The FWHM for each layer being almost the same implies excellent epitaxy through the multilayer structure.

FIG. 5 shows the out-of-plane texture as determined by rocking curves in the rolling direction and about the rolling direction of the Ni—13% Cr substrate. As shown, the out-of-plane texture in both directions tends to sharpen in the YBCO layer as compared to the Ni—13% Cr substrate.

Electron backscatter Kikuchi diffraction (EBKD) created orientation image micrographs were also obtained for the YBCO layer. The EBKD patterns were obtained on a hexagonal grid with a spacing of 3.5 μm. A hypothetical hexagonal lattice with a grain size of 3.5 μm was superimposed at each point from which a pattern was obtained. Grain boundary misorientations were then calculated for all the resulting boundaries using standard techniques. The micrograph was then regenerated with certain grain boundary criteria in order to visualize percolation of current flow in the epitaxial superconducting film. Most of the YBCO film was percolatively connected within 5°. This is similar to that which was obtained for the Ni—13% Cr substrate illustrated in FIG. 2.

Figure 6:
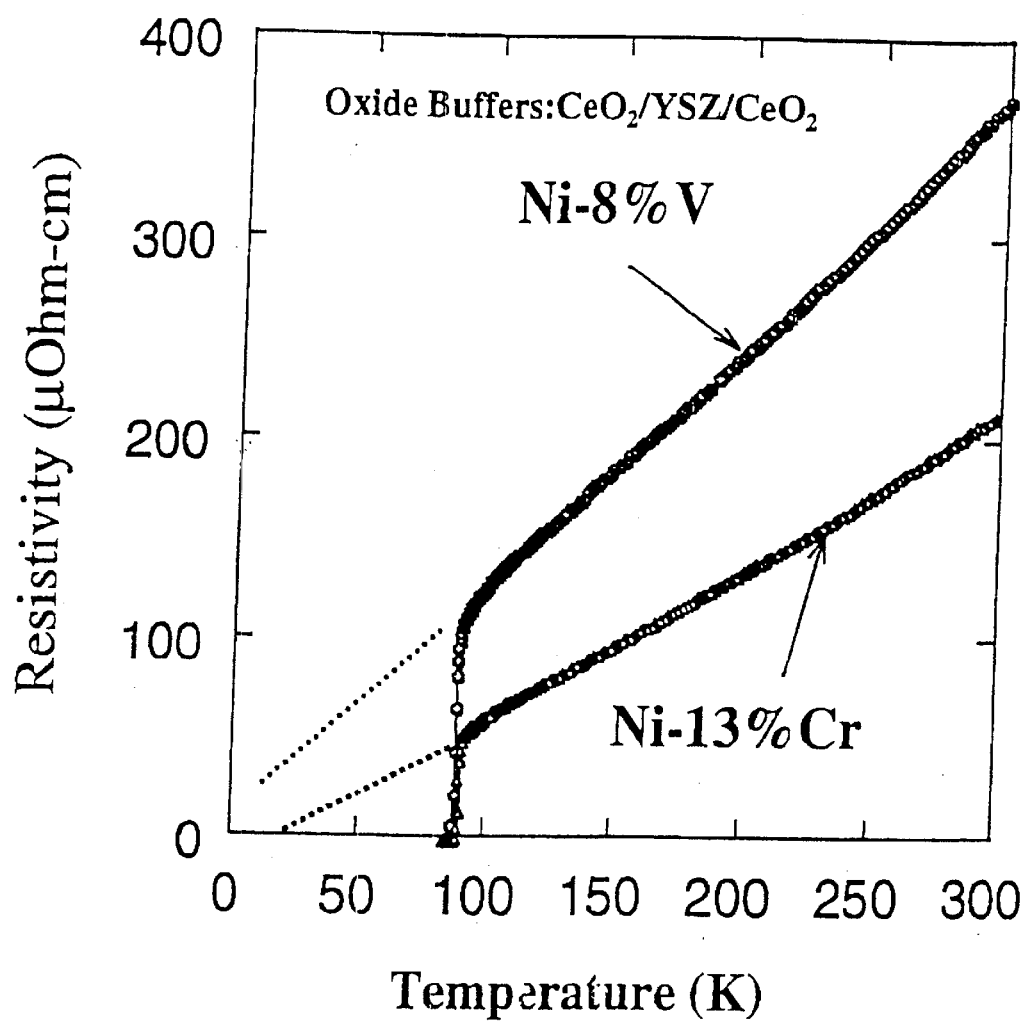
FIG. 6 is the resistivity plot for YBCO films on CeO$_2$/YSZ/CeO$_2$/Ni/Ni—8% V and CeO$_2$/YSZ/CeO$_2$/Ni/Ni—13% Cr.

FIG. 6 illustrates a resistivity plot for the YBCO film in the multilayer structure. Resistivity is plotted as a function of the temperature. A sharp transition at 90° K is evident. Also, extrapolation of the resistivity curve above the superconducting transition temperature of approximately 90° K indicates no extrapolated residual resistivity at 0° K.

Figure 7:
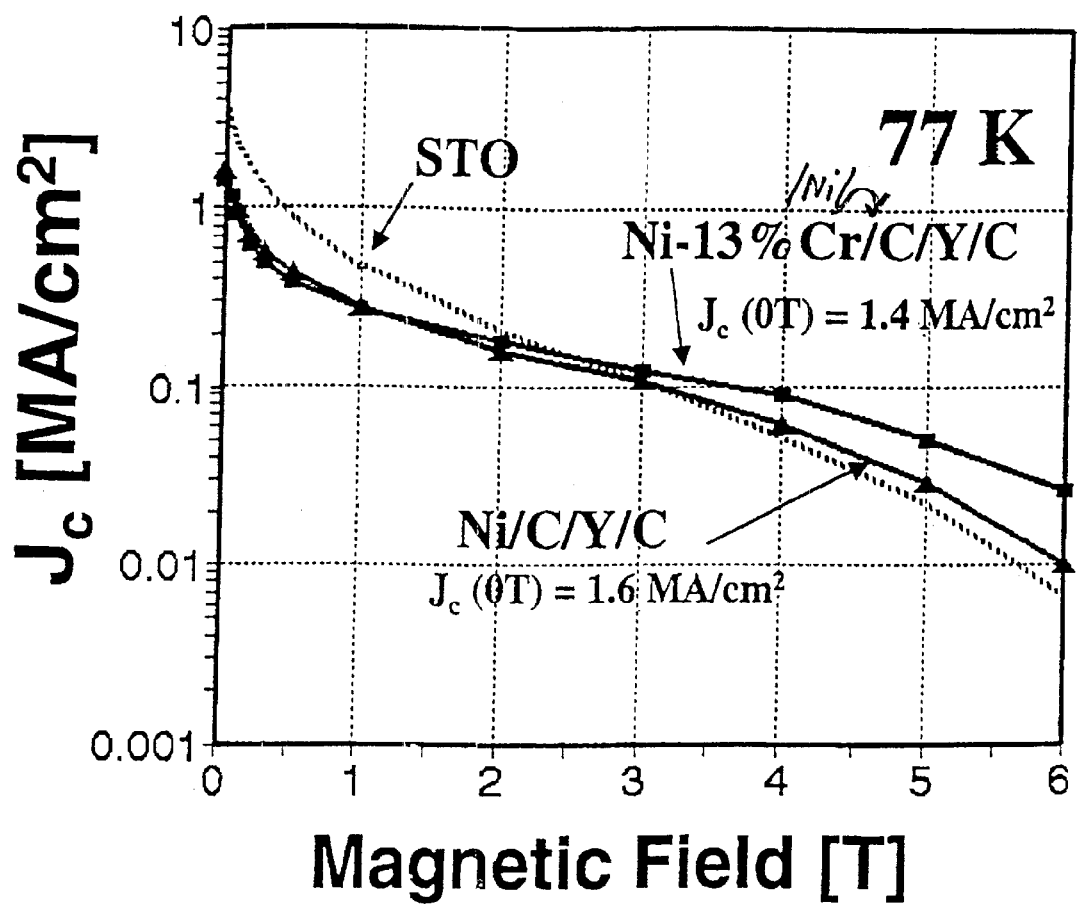
FIG. 7 is the critical current density of the YBCO film as a function of the applied magnetic field at 77° K.

FIG. 7 illustrates the critical current density ($J_c$) of the YBCO film as a function of the applied magnetic field. Also shown in the figure is data for an epitaxial YBCO film on single crystal $SrTiO_3$ and a pure Ni substrate. The zero-field $J_c$ for the YBCO film on Ni—13% Cr is 1.4 $MA/cm^2$. This result is very similar to that obtained for pure Ni, which is 1.6 $MA/cm^2$. The in-field behavior of $J_c$ is also similar for YBCO films on Ni—13% Cr and the pure Ni substrate. In both instances, the in-field $J_c$ is superior to that obtained for YBCO on single crystal $SrTiO_3$.

EXAMPLE 2

A biaxially textured Ni—8% V alloy substrate was fabricated. The fabrication included successive deformation of a Ni—8% V rod to greater than 99% deformation, followed by annealing at 1000° C. for 1 hour in a high vacuum furnace.

FIG. 8a illustrates a (111) pole figure of the resulting Ni—8% V substrate showing the presence of very well developed {100}<100> cube texture. FIG. 8b shows a (111) phi scan of the substrate showing a full-width-half-maximum (FWHM) of the in-plane texture of the substrate to be 7°. The out-of-plane texture of the substrate, as determined by omega scans, was found to be 5.6° in the rolling direction and 10° about the rolling direction.

Figure 9:
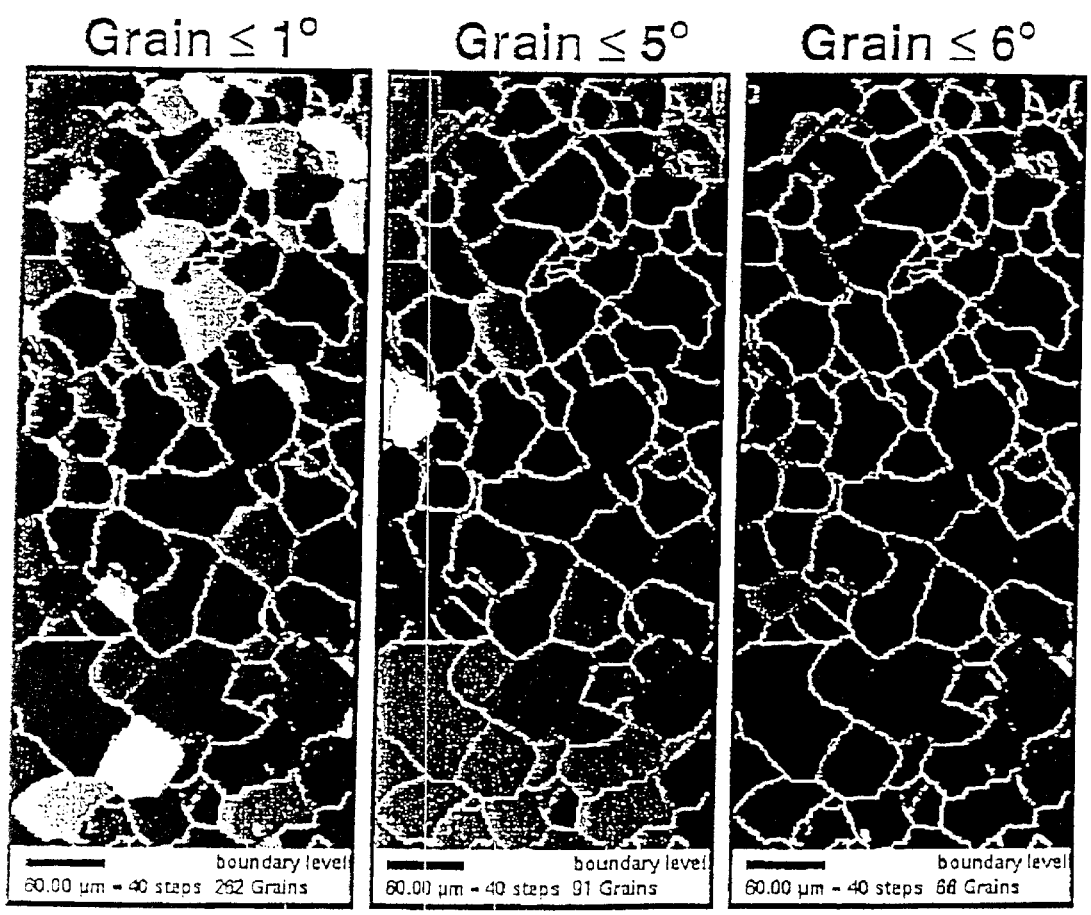
FIG. 9 is the orientation image micrographs of the Ni—8% V substrate.

FIG. 9 shows electron back scatter Kikuchi diffraction (EBKD) created orientation image micrographs of the biaxially textured substrate. The EBKD patterns were obtained on a hexagonal grid with a spacing of 1.5 μm. Indexing of the pattern at each location gave an unique measure of the orientation at that point. A hypothetical hexagonal lattice with a grain size of 1.5 μm was superimposed at each point from which a pattern was obtained. Grain boundary misorientations were then calculated for all the resulting boundaries using standard techniques. The micrograph was then regenerated with certain grain boundary criteria in order to visualize percolation of current flow should an epitaxial superconducting film be grown on such a substrate.

FIG. 9 shows shading of the sampled region of the substrate according to the criterion that a single shade represents a contiguous or percolative region of orientation less than or equal to 1°, 5° and 6°, respectively. As illustrated, most of the substrate is percolatively connected within 6°.

After preparation of the Ni—8% V substrate, an epitaxial layer of Ni was deposited on the Ni—8% V substrate. The 5 μm thick Ni layer was deposited at 300° C. using magnetron sputtering from a Ni sheet.

Upon deposition of the Ni layer, a 100 Å thick epitaxial layer of $CeO_2$ was deposited over the Ni layer. The $CeO_2$ layer was deposited at 500° C. by reactive evaporation of Ce metal in the presence of a forming gas having the mixture of 4% $H_2$ and 96% Ar. Because of thermodynamic considerations, a partial pressure of approximately $7\times10^{-7}$ Torr of $H_2O$ was used during the reactive evaporation of Ce to form stoichiometric $CeO_2$.

Yttria stabilized Zirconia (YSZ) films were then deposited over the $CeO_2$ layer. The 4000 Å thick YSZ layer was deposited at 780° C. using rf magnetron sputtering.

After the deposition of the YSZ film, another layer of $CeO_2$ was then deposited on the YSZ layer. The 100 Å thick $CeO_2$ layer was deposited using rf magnetron.

The resulting multilayer had the following layers: Ni—8% V (50 μm)/Ni (5 μm)/$CeO_2$ (100 Å)/YSZ (4000 Å)/$CeO_2$ (100 Å). This structure was then pre-annealed at 650° C. for 30 minutes under low oxygen partial pressures.

YBCO was deposited on the multilayer structure described above using the $BaF_2$ ex-situ process. YBCO precursor films with a thickness of 0.33 μm were first deposited by electron beam evaporation of Y, Cu metals and $BaF_2$. The combined deposition rate was approximately 0.6 nm/s. The deposited precursor films were post-annealed at 740° C. for 60 minutes in a flowing mixture containing 200–300 ppm (parts-per-million) $O_2$ and 2.6–10% $H_2O$ in $N_2$. Water vapor was added during the annealing process to facilitate the decomposition of $BaF_2$. The final heat treatment was concluded with an oxidation anneal in 1 atmosphere of $O_2$ at 500° C. for 30 minutes to fully oxygenate the YBCO.

Figure 10:
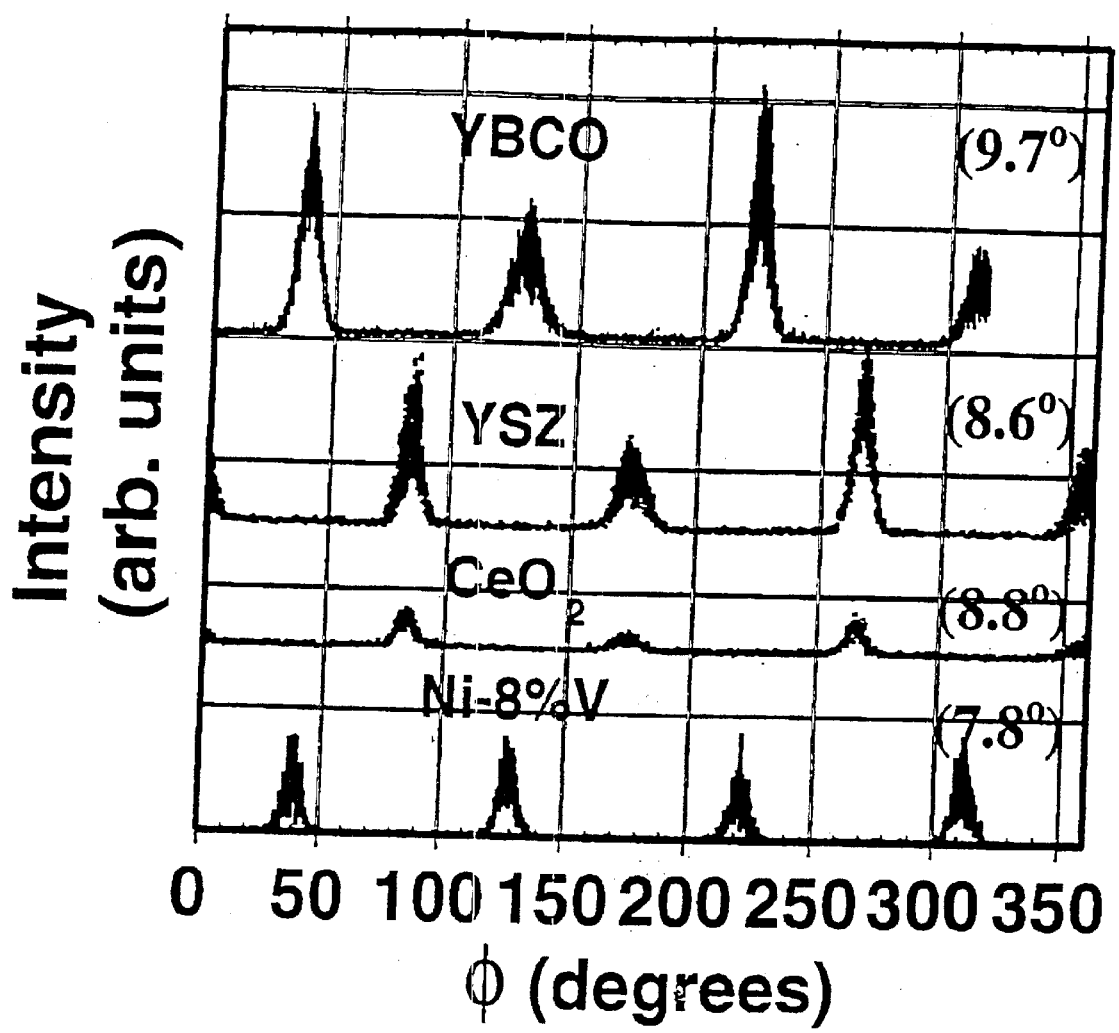
FIG. 10 is a phi scan of the YBCO (103) reflection (FWHM=9.7°), the YSZ (111) reflection (FWHM=8.6°), the CeO$_2$ (111) reflection (FWHM=8.8°), and the Ni—8% V (111) reflection (FWHM=7.8°) for the multilayer structure.

Respective phi scans for the layers of the multilayer structure are illustrated in FIG. 10. For each layer, only four peaks every 360° are observed. This pattern is consistent with the cube texture and single orientation epitaxy between the layers. Also, FIG. 10 includes the FWHM of the peaks for each layer.

FIG. 6 shows a resistivity plot for the YBCO film on this multilayer structure. Resistivity is plotted as a function of the temperature. A sharp transition at 90° K is evident. The $J_c$ of this film was 240,000 A/cm$^2$ at 77° K and the extrapolated resistivity at 0° K shows no extrapolated residual resistivity.

EXAMPLE 3

A biaxially textured Ni—13% Cr alloy substrate was fabricated. The fabrication included successive deformation of a Ni—13% Cr rod to greater than 99% deformation followed by annealing at 1000° C. for 1 hour in a high vacuum furnace.

After preparation of the Ni—13% Cr substrate, an epitaxial layer of Ni was deposited on the Ni—13% Cr substrate. The 5 μm Ni layer was deposited at 300° C. using magnetron sputtering from a Ni sheet.

Upon deposition of the Ni layer, a composition having multiple films ($CeO_2$/YSZ/$CeO_2$/YBCO) was deposited on the Ni surface using pulsed laser ablation. The buffer layers were deposited at 710° C., and the YBCO film was deposited at 750° C. The (100) $CeO_2$ nucleation layer on the (100) Ni surface was prepared using a three-step deposition process as described below.

The initial nucleation layer of $CeO_2$ is deposited in 180 mTorr of 4% $H_2$/Ar to prevent the oxidation of the Ni surface. This layer had an approximate thickness of 30 nm. The 4% $H_2$/Ar gas was then evacuated while an additional 50 nm of $CeO_2$ was deposited. Finally, an ambient of $10^{-4}$ Torr $O_2$ was introduced for additional $CeO_2$ film growth. A YSZ layer was then deposited in $10^{-4}$ Torr $O_2$. Prior to the deposition of YBCO, a thin $CeO_2$ layer was deposited as an epitaxial buffer between YSZ and the superconductor.

Figure 11:
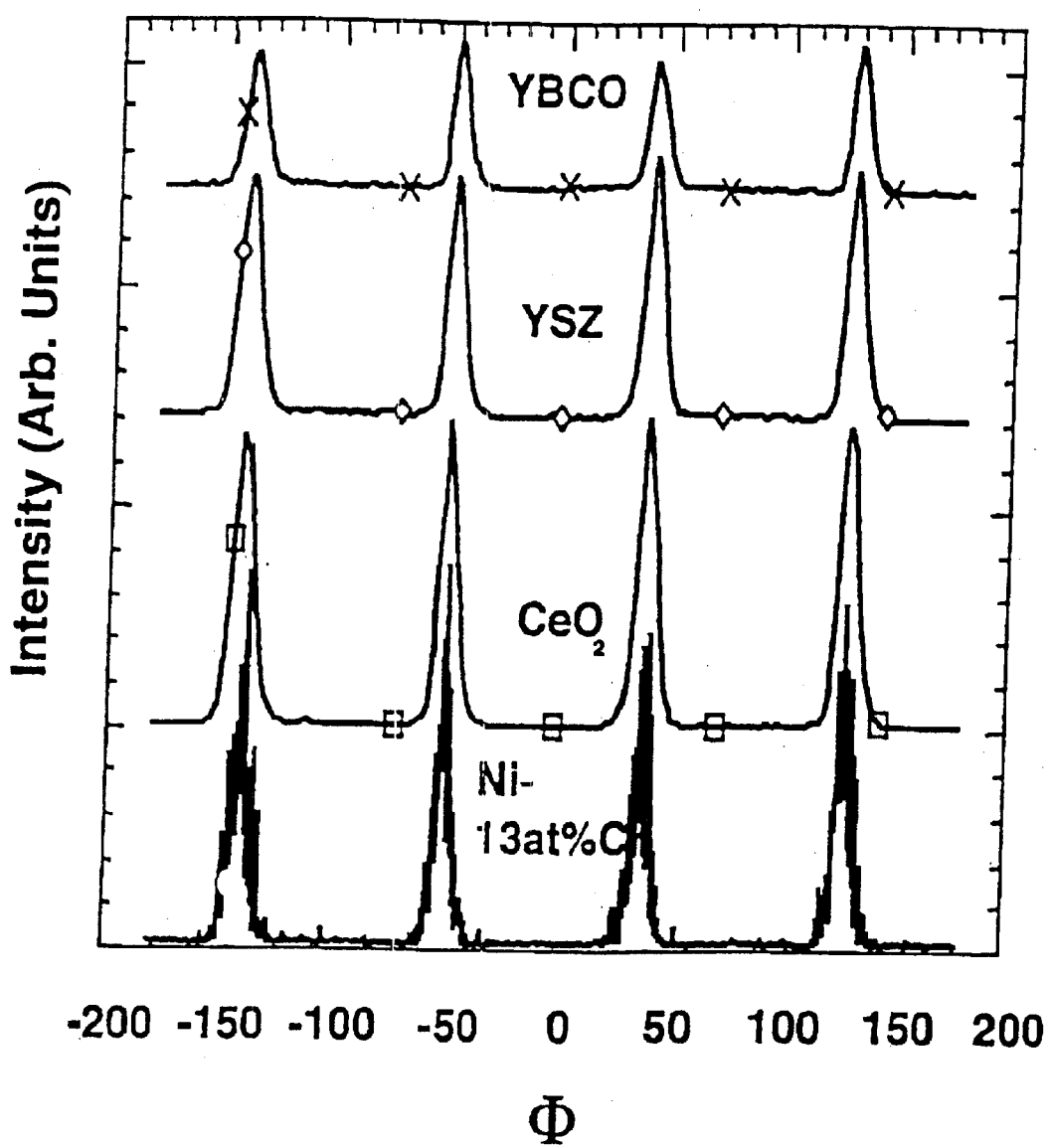
FIG. 11 is a phi scan of the multilayer structure of YBCO/YSZ/CeO$_2$/Ni/Ni—13% Cr showing single orientation epitaxy between the layers.

FIG. 11 shows x-ray diffraction measured phi scans showing the in-plane texture of all the layers and the Ni—13% Cr substrate. Good epitaxy from the alloy substrate to the YBCO layers is evident. The critical current density of the YBCO film on this substrate was approximately 220,000 A/cm$^2$ at 77° K and the extrapolated resistivity at 0° K shows no extrapolated residual resistivity.

EXAMPLE 4

A biaxially textured Ni—13% Cr alloy substrate was fabricated. The fabrication included successive deformation of a Ni—13% Cr rod to greater than 99% deformation followed by annealing at 1000° C. for 1 hour in a high vacuum furnace.

After preparation of the Ni—13% Cr substrate, an epitaxial layer of Ni was deposited on the Ni—13% Cr substrate. The 5 μm Ni layer was deposited at 300° C. using magnetron sputtering from a Ni sheet.

Upon deposition of the Ni layer, a composition having multiple films ($CeO_2$/YSZ/$CeO_2$/YBCO) was deposited on the Ni surface using e-beam evaporation and rf sputtering. A 100 Å thick epitaxial layer of $CeO_2$ was deposited at 500° C. by reactive evaporation of Ce metal in the presence of a forming gas having the mixture of 4% $H_2$ and 96% Ar. Because of thermodynamic considerations, a partial pressure of approximately $7\times10^{-7}$ Torr of $H_2O$ was used during the reactive evaporation of Ce to form stoichiometric $CeO_2$.

Yttria stabilized Zirconia (YSZ) films were then deposited over the $CeO_2$ layer. The 4000 Å thick YSZ layer was deposited at 780° C. using rf magnetron sputtering.

After the deposition of the YSZ film, another layer of $CeO_2$ was then deposited on the YSZ layer. The 100 Å thick $CeO_2$ layer was deposited using rf magnetron sputtering. The YBCO layer was deposited using pulsed laser ablation at 750° C.

X-ray diffraction showed good epitaxy and transference of texture from the Ni—13%Cr to the YBCO layer. The critical current density of the YBCO film on this substrate was approximately 550,000 A/cm$^2$ at 77° K and the extrapolated resistivity at 0° K shows no extrapolated residual resistivity.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof for an indication of the scope of the invention.

What is claimed is:

1. A laminate article, comprising:
   a metal alloy substrate; and,
   a biaxially textured protective metal layer over said alloy substrate for preventing oxidation of said alloy substrate, said protective metal layer comprising Ni.

2. The laminate article according to claim 1, wherein said alloy substrate is biaxially textured and has a FWHM of the in-plane texture less than about 20°.

3. The laminate article according to claim 1, wherein said alloy substrate has a magnetism less than pure nickel.

4. The laminate article according to claim 1, wherein said alloy substrate has a mechanical strength higher than pure nickel.

5. The laminate article according to claim 1, wherein said alloy substrate is selected from the group consisting of nickel, copper, iron, aluminum, silver and alloys containing any of the foregoing.

6. The laminate article according to claim 1, wherein said alloy substrate is formed from an alloy having a stacking fault frequency less than about 0.01 at room temperature.

7. The laminate article according to claim 1, further comprising a layer of YBCO over said metal protective layer.

8. The laminate article according to claim 7, further comprising a layer of $CeO_2$ between said YBCO layer and said metal protective layer.

9. The laminate article according to claim 8, further comprising a layer of YSZ between said $CeO_2$ layer and said metal protective layer.

10. The laminate article according to claim 9, further comprising a second $CeO_2$ layer disposed between said YSZ layer and said metal protective layer.

11. The laminate article according to claim 1, wherein said metal protective layer is a nickel alloy.

12. The laminate article according to claim 1, further comprising at least one buffer layer disposed on said metal protective layer.

13. The laminate article according to claim 12, wherein said at least one buffer layer is at least one selected from the group consisting of $CeO_2$, YSZ, $LaAlO_3$, $SrTiO_3$, $Y_2O_3$, $RE_2O_3$, $SrRuO_3$, $LaNiO_3$ and $La_2ZrO_3$.

14. The laminate article according to claim 13, wherein said at least one buffer layer is an epitaxial layer.

15. The laminate article according to claim 1, further comprising an epitaxial superconducting layer over the metal protective layer.

16. The laminate article according to claim 15, wherein said superconducting layer has a $J_c$ over 240,000 A/cm$^2$ at 77° K and self-field.

17. A laminate superconducting article, comprising:
a metal alloy substrate having a magnetism less than pure nickel;
a biaxially textured metal protective layer over said alloy substrate, said biaxially textured protective metal layer for preventing oxidation of said metal alloy substrate, said protective metal layer comprising Ni;
at least one buffer layer over said metal protective layer, and,
a superconducting layer over said at least one buffer layer.

18. The laminate superconducting article according to claim 17, wherein said at least one buffer layer is at least one selected from the group consisting of $CeO_2$, YSZ, $LaAlO_3$, $SrTiO_3$, $Y_2O_3$, $Re_2O_3$ $RE_2O_3$, $SrRuO_3$ and $LaNiO_3$.

19. A method of forming a laminate article, comprising the steps of:
rolling a metal substrate;
annealing said metal substrate to form a biaxially textured metal substrate; and,
depositing a metal protective layer over said biaxially textured metal substrate, said metal protective layer for preventing oxidation of said metal substrate, wherein said protective metal layer comprises Ni.

20. The method according to claim 19, further comprising a step of cleaning a surface of said metal substrate before said depositing step.

21. The method according to claim 19, wherein said metal substrate has a magnetism less than pure nickel.

22. A method according to claim 19, wherein said metal substrate is at least one selected from the group consisting of nickel, copper, iron, aluminum, silver and alloys containing any of the foregoing.

23. The method according to claim 19, wherein said protective layer is a nickel alloy.

24. The method according to claim 19, wherein processing used to deposit an oxide buffer layer does not oxidize said metal protective layer.

25. The method according to claim 19, wherein said metal protective layer is deposited using a magnetron process.

26. The method according to claim 19, wherein said biaxially textured substrate has a FWHM of in-plane texture less than about 20°.

27. The method according to claim 19, further comprising a step of depositing at least one buffer layer over said metal protective layer.

28. The method according to claim 27, further comprising the step of depositing a superconductor layer over said at least one buffer layer.

29. The method according to claim 27, wherein said at least one buffer layer is at least one selected from the group consisting of $CeO_2$, YSZ, $LaAlO_3$, $SrTiO_3$, $Y_2O_3$, $RE_2O_3$, $SrRuO_3$, $LaNiO_3$ and $La_2ZrO_3$.

30. The method according to claim 27, wherein said at least one buffer layer is selected from the group consisting of oxides.

31. The method according to claim 19, further comprising a step of depositing an epitaxial superconducting layer over said metal protective layer.

32. The method according to claim 31, wherein said superconducting layer has a $J_c$ over 240,000 A/cm$^2$ at 77° K and self-field.

33. The method of claim 31, wherein said superconducting layer has a $J_c$ of approximately at least 1.0 MA/cm$^2$ at 77° K and self-field.

34. The laminate superconducting article according to claim 33, wherein said superconducting layer comprises YBCO, said superconducting layer having a $J_c$ of approximately at least 1.0 MA/cm$^2$ at 77 K and self-field.

35. A laminate superconducting article, comprising:
a Ni alloy substrate having a magnetism less than pure nickel;
a biaxially textured metal protective layer over said Ni alloy substrate, said biaxially textured protective metal layer for preventing oxidation of said metal alloy substrate, said protective metal layer comprising Au;
at least one buffer layer over said metal protective layer, and,
a superconducting layer over said at least one buffer layer.

* * * * *